(12) United States Patent
Trusov et al.

(10) Patent No.: US 8,094,841 B2
(45) Date of Patent: Jan. 10, 2012

(54) APPARATUS AND METHOD USING CAPACITIVE DETECTION WITH INHERENT SELF-CALIBRATION

(75) Inventors: Alexander A. Trusov, Irvine, CA (US); Andrei M. Shkel, Irvine, CA (US)

(73) Assignee: The Regents of the University of California, Oakland, CA (US)

(*) Notice: Subject to any disclaimer, the term of this patent is extended or adjusted under 35 U.S.C. 154(b) by 1037 days.

(21) Appl. No.: 11/971,767

(22) Filed: Jan. 9, 2008

(65) Prior Publication Data

US 2008/0170742 A1 Jul. 17, 2008

Related U.S. Application Data

(60) Provisional application No. 60/880,971, filed on Jan. 17, 2007.

(51) Int. Cl.
*H04R 25/00* (2006.01)
(52) U.S. Cl. ........... 381/174; 381/396; 73/504.12
(58) Field of Classification Search .......... 381/174, 381/396; 73/504.12, 579, 657
See application file for complete search history.

(56) References Cited

U.S. PATENT DOCUMENTS

| | | | |
|---|---|---|---|
| 5,850,041 A * | 12/1998 | Kumar et al. | 73/504.12 |
| 6,545,495 B2 | 4/2003 | Warmack et al. | |
| 6,763,723 B1 * | 7/2004 | Zook et al. | 73/657 |
| 6,917,138 B2 | 7/2005 | Nguyen | |
| 2004/0211260 A1 * | 10/2004 | Girmonsky et al. | 73/579 |

OTHER PUBLICATIONS

A.A. Trusov and A.M. Shkel, "Nonlinearity of capacitive detection in resonant mems," to be published, IEEE ID JMEMS 2006-0286, 2007.
A.A. Trusov and A.M. Shkel, "A novel capacitive detection scheme with inherent self-calibration," to be published, IEEE ID JMEMS-2006-0292, 2007.

* cited by examiner

*Primary Examiner* — Phuc Dang
(74) *Attorney, Agent, or Firm* — Daniel L. Dawes; Marcus C. Dawes

(57) ABSTRACT

The illustrated embodiment of the invention includes a capacitive detection method in a MEMS resonator comprising the steps of: vibrating a resonator with a drive signal; sensing vibration of the resonator by detecting a plurality of sidebands of an electromechanical amplitude modulation signal in a capacitive detector; and extracting amplitude of motion from a ratio of two simultaneously sensed sidebands of different order.

18 Claims, 9 Drawing Sheets

APPARATUS AND METHOD USING CAPACITIVE DETECTION WITH INHERENT SELF-CALIBRATION

RELATED APPLICATIONS

The present application is related to U.S. Provisional Patent Application Ser. No. 60/880,971, filed on Jan. 17, 2007, which is incorporated herein by reference and to which priority is claimed pursuant to 35 USC 119.

This invention was made with government support under grant 0409923 awarded by the National Science Foundation. The government has certain rights in the invention.

BACKGROUND OF THE INVENTION

1. Field of the Invention

The invention relates to the field of a methodology and detection system for nonlinear, parallel plate EAM detection, using multiple order sidebands to derive the amplitude of mechanical motion in a MEMS device.

2. Description of the Prior Art

Several important classes of MEMS devices, such as resonators, gyroscopes, and chemical sensors, rely on resonance phenomenon in their operation. In these devices, resonant motion needs to be actuated, sensed, and controlled. Capacitive phenomena are commonly used for transduction in vibratory MEMS devices due to the ease of fabrication, low sensitivity to temperature changes, and other practical advantages. However, conventional capacitive detection methodologies produce a signal proportional to such system parameters as nominal sense capacitance, carrier voltage, and gain of the current amplifier. These dependencies constitute a need to calibrate individual MEMS devices to address fabrication imperfections, and fluctuation of the parameters due to changing environment and aging. A detection technique independent of these system parameters can be of great advantage.

Capacitive detection of harmonic motion is often based on measuring the current induced by the relative motion of the capacitive electrodes. The variable sense capacitor is formed between a mobile mass and anchored electrodes. This capacitor is biased by a certain known DC or AC voltage. The motion induced change in capacitance results in the flow of current, which is converted to voltage. This output voltage detected and related to the motion of the resonant structure. Typically, for the same real estate, parallel plate sense capacitors provide much higher capacitive gradient and thus sensitivity. However, unlike lateral combs, parallel plates generate sense signal that is nonlinear with motional amplitude. Historically, this limited the use of parallel plate capacitive detection to small amplitudes of motion (e.g., sense mode of vibratory gyroscopes).

Electromechanical amplitude modulation (EAM) is a widely used capacitive detection approach. It is based on modulation of motional signal by an AC probing voltage (carrier), and allows for frequency domain separation between the informational signals and feed-through of the driving voltages. Conventional linear EAM can be used for either lateral comb sense capacitors or small displacement parallel plate capacitors. In the linear case only one pair of modulated sidebands exist and calibration of the pick-up signal is needed.

Capacitive detection of motion is commonly used in MEMS; however, conventional methodologies are sensitive to variations in system parameters and require periodic calibration. This disclosure describes an algorithm which is robust to parameters variation. One focus of the disclosure is a parallel plate capacitive detection methodology for real-time measurement of arbitrary amplitude of motion in resonant devices. Unlike conventional methods, the disclosed measurement algorithm does not depend on such system parameters, such as nominal sense capacitance, probing voltage, and trans-impedance gain of the motional current amplifier. A real-time measurement algorithm is formulated and simulated. Feasibility of the developed approach is demonstrated experimentally. The invention is especially valuable for robust capacitive detection and self-calibration in resonant structures, such as gyroscopes, resonant microbalances, and chemical sensors.

BRIEF SUMMARY OF THE INVENTION

The illustrated embodiment of the invention includes a capacitive detection method in a MEMS resonator comprising the steps of: vibrating a resonator with a drive signal; sensing vibration of the resonator by detecting a plurality of sidebands of an electromechanical amplitude modulation signal in a capacitive detector; and extracting amplitude of motion from a ratio of two simultaneously sensed sidebands of different order.

The step of extracting amplitude of motion from a ratio of two simultaneously sensed sidebands of different order comprises simultaneously processing multiple sidebands and producing a measurement of $x_o$ by using a ratio r of two different order sidebands.

The step of sensing vibration of the resonator by detecting a plurality of sidebands of an electromechanical amplitude modulation signal in a capacitive detector and simultaneously processing multiple sidebands and producing a measurement of $x_o$ by using a ratio r of two different order sidebands comprises sensing a first pair of sidebands $V_{\omega_{-(k+1)}}$ and $V_{\omega_{(k+1)}}$ and a second pair of sidebands $V_{\omega_{-k}}$ and $V_{\omega_k}$, obtaining the ratio $r(x_o)$ $$\frac{\|V_{\omega-(k+1)}\| + \|V_{\omega_{(k+1)}}\|}{\|V_{\omega-k}\| + \|V_{\omega_k}\|} = r(x_0) = \frac{x_0}{\left(1 + \sqrt{1-x_0^2}\right)}$$

and deriving $x_o$ therefrom, where $x_o$ is normalized motional amplitude, where $V_{\omega_i}$ is the harmonic component of a $i^{th}$ sideband frequency $\omega_i$ of the total output voltage.

The step of sensing vibration of the resonator by detecting a plurality of sidebands of an electromechanical amplitude modulation signal in a capacitive detector and simultaneously processing multiple sidebands and producing a measurement of $x_o$ by using a ratio r of two different order sidebands comprises sensing a first pair of sidebands $V_{\omega_{-(k+1)}}$ and $V_{\omega_{(k+1)}}$ and a second pair of sidebands $V_{\omega_{-k}}$ and $V_{\omega_k}$, obtaining the ratio $r(x_o)$ $$r(x_0) \approx \frac{\|V_{\omega_c} \pm (k+1)\omega_d\|}{\|V_{\omega_c} \pm k\omega_d\|}$$

$$r(x_0) = \frac{x_0}{\left(1 + \sqrt{1-x_0^2}\right)}$$

and deriving $x_o$ therefrom, where $x_o$ is normalized motional amplitude, where $V_{\omega_i}$ is the harmonic component of a $i^{th}$ sideband frequency $\omega_i$ of the total output voltage.

The step of deriving $x_o$ comprises setting $x_o=2r(x_o)$

For example, where $\omega_c$ is a carrier frequency and $\Omega_d$ a drive frequency applied to the resonator, the step of sensing vibration of the resonator by detecting a plurality of sidebands of an electromechanical amplitude modulation signal in a capacitive detector comprises detecting amplitudes of first order sidebands at frequencies $\omega_c \pm \omega_d$ and detecting amplitudes of second order sidebands at frequencies $\omega_c \pm 2\omega_d$; and where the step of extracting amplitude of motion from a ratio of two simultaneously sensed sidebands of different order comprises calculating a ratio of amplitudes using $$r = \frac{\|V_{\omega_{-2}}\| + \|V_{\omega_2}\|}{\|V_{\omega_{-1}}\| + \|V_{\omega_1}\|} \text{ or}$$

estimate using a single side pair of sidebands using $$r \approx \frac{\|V_{\omega_{-2}}\|}{\|V_{\omega_{-1}}\|} \approx \frac{\|V_{\omega_2}\|}{\|V_{\omega_1}\|}$$

and
calculating normalized amplitude of motion $$x_0 = \frac{2r}{r^2+1}.$$

In the case where $\omega_c$ is a carrier frequency and $\omega_d$ a drive frequency applied to the resonator, the step of sensing vibration of the resonator by detecting a plurality of sidebands of an electromechanical amplitude modulation signal in a capacitive detector comprises differentially detecting amplitudes of a first pair of sidebands at frequencies $\omega_c \pm k\omega_d$ where k is an odd integer and detecting amplitudes of a second pair of sidebands at frequencies $\omega_c \pm (k+2)\omega_d$; and the step of extracting amplitude of motion from a ratio of two simultaneously sensed sidebands of different order comprises calculating a ratio of amplitudes using $$r(x_0) = \sqrt{\frac{\|V_{\omega-(k+2)}\| + \|V_{\omega(k+2)}\|}{\|V_{\omega-k}\| + \|V_{\omega k}\|}}$$

and
calculating normalized amplitude of motion from $r(x_o)$.

In the embodiment where $\omega_c$ is a carrier frequency and $\omega_d$ a drive frequency applied to the resonator, the step of sensing vibration of the resonator by detecting a plurality of sidebands of an electromechanical amplitude modulation signal in a capacitive detector comprises differentially detecting amplitudes of a first pair of sidebands at frequencies $\omega_c \pm k\omega_d$ where k is an odd integer and detecting amplitudes of a second pair of sidebands at frequencies $\omega_c \pm (k+2)\omega_d$; and the step of extracting amplitude of motion from a ratio of two simultaneously sensed sidebands of different order comprises calculating a ratio of amplitudes using $$\approx \sqrt{\frac{\|V_{\omega\pm(k+2)}\|}{\|V_{\omega\pm k}\|}} \ r(x_0)$$

and
calculating normalized amplitude of motion from $r(x_o)$.

In the embodiment where $\omega_d$ a drive frequency applied to the resonator, where the electromechanical amplitude modulation signal is a DC signal, and the step of sensing vibration of the resonator by detecting a plurality of sidebands of an electromechanical amplitude modulation signal in a capacitive detector comprises detecting amplitudes at frequencies $\omega_d$ and $2\omega_d$; and the step of extracting amplitude of motion from a ratio of two simultaneously sensed sidebands of different order comprises calculating a ratio of amplitudes using $$\frac{\|V_{2\omega_d}\|}{2\|V_{\omega_d}\|}$$

$r(x_0)=$
and
calculating normalized amplitude of motion from $r(x_o)$.

In the embodiment where $\omega_d$ a drive frequency applied to the resonator, and where the electromechanical amplitude modulation signal is a DC signal, the step sensing vibration of the resonator by detecting a plurality of sidebands of an electromechanical amplitude modulation signal in a capacitive detector comprises differentially detecting amplitudes at frequencies odd harmonic drive frequencies $k\omega_d$ and $(k+2)\omega_d$ where k is an odd integer; and the step of extracting amplitude of motion from a ratio of two simultaneously sensed sidebands of different order comprises calculating a ratio of amplitudes using $$r(x_0) = \sqrt{\frac{k\|V_{(k+2)\omega_d}\|}{(k+2)\|V_{k\omega_d}\|}} = \sqrt{\frac{\|V_{3\omega_d}\|}{3\|V_{\omega_d}\|}}.$$

and
calculating normalized amplitude of motion from $r(x_o)$.

The illustrated embodiment of the invention also includes within its scope a detection system for performing or implementing each of the forgoing embodiments of the methodology.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 4b is a graph of the experimental measurement of parallel plates EAM pick-up signal at different motional amplitudes of the device of FIG. 4a.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

We disclose a capacitive detection method with inherent self-calibration. A detailed description of the nonlinear nature of the parallel plate capacitive detection can be found in A. Trusov and A. M. Shkel, "Nonlinearity of capacitive detection in resonant mems," to be published, IEEE ID JMEMS 2006-0286, 2007; and—, "A novel capacitive detection methodology with inherent self-calibration," to be published, IEEE ID JMEMS-2006-0292, 2007. The approach constructively utilizes nonlinear effects of parallel plate EAM detection. In the case of parallel plate EAM, there exist multiple order sidebands that carry redundant information about the amplitude of mechanical motion. Amplitude of motion can be extracted from the ratio of two simultaneously measured sidebands of different order. Unlike conventional methods, the disclosed measurement procedure does not depend on nominal sense capacitance, amplitude of bias voltage, trans-impedance gain of the motional current amplifier and other parameters.

The illustrated embodiment of the invention includes a Capacitive detection methodology, comprised of parallel plate sense capacitor(s) and signal processing algorithm, for detection of vibratory motion with the following advantages over conventional approaches:

1) precise detection of arbitrary amplitude of motion
2) independence from system parameters, which are prone to imperfect fabrication and drift (nominal sense capacitance, probing voltage, gain of electrical pick-up current amplifier etc.)

Implementation of the above methodology for the cases of:

1) detection using both DC and/or AC probing voltage
2) detection using single side sense capacitor as well as using differential (balanced) sense capacitors.

The disclosed methodology can be used as a substitute for conventional methodologies, or for automatic calibration of the latter.

The disclosed methodology can be implemented using the same common components (operational amplifiers) as conventional detection methodologies.

Figure 1:
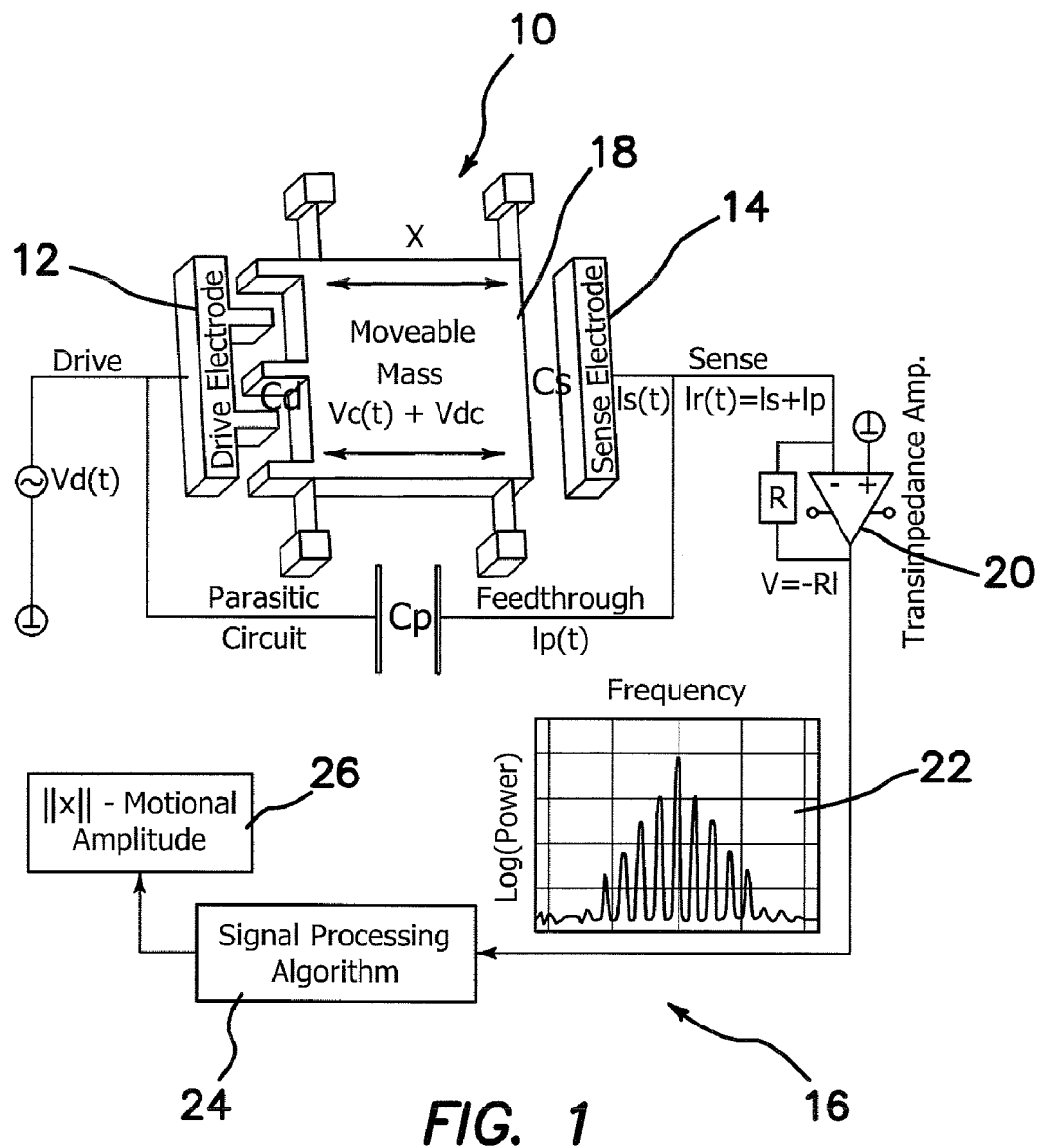
FIG. 1 is a block diagram of a capacitive MEMS resonator with parallel plate detection of motion according to the illustrated embodiment of the invention.

Consider now an electromechanical model of the illustrated embodiment of the invention. FIG. 1 is a block diagram of a capacitive micro-resonator 10, which is a basic element of various micro-sensors. The electro-mechanical diagram of FIG. 1 includes the mechanical resonator 10, the electrostatic drive electrodes 12 and sense electrodes 14, and a signal processing circuit 16 which measures the amplitude of motion. As described below the EAM signal 22 is subjected to the disclosed signal processing algorithm in a computer or signal processing circuit 24 to generate a motional amplitude result 26.

The suspended mass 18 of the resonator 10 is constrained to move only along the horizontal x-axis shown in FIG. 1 by the double headed arrows. The invention is not limited to unidirectional vibration, which is a restriction imposed here only for the purpose of ease of illustration and understanding. The variable sense capacitance is defined as $C_s(x)$, and the drive capacitance $C_d(X)$, where x is the displacement. Typically in MEMS devices, drive and sense terminals are not completely isolated, but are electrically coupled by stray parasitic capacitors and resistors. In the model of FIG. 1 we assume, without loss of generality, that the parasitic circuit consists of a single lumped capacitor $C_p$. An AC driving voltage $V_d(t) = V_d \cos(\omega_d t)$ is applied to the drive electrode 12 (voltage values are referenced with respect to a common ground) to actuate a harmonic motion. The sense capacitor $C_s$ is formed between the mobile mass 18 and the fixed sense electrode 14. The sense electrode 14 is connected to the inverting input of an operational amplifier 20 which is configured as a trans-impedance amplifier.

The oscillatory motion at the drive frequency $\omega_d$ is excited by a combination of $V_{dc}$ and $V_d$ driving voltages across the drive capacitor $C_d$. Without discussing further details of the actuation methodology, resonator's displacement x(t) can be expressed as a. $x(t) = \|x\| \sin(\omega_d t + \phi)$,  (1)

where $\phi = \phi(\omega_d)$ represents a phase lag in the transfer function of the resonator.

Due to the motion the sense capacitance $C_s(x)$ changes, causing a flow of motional current $I_s = d(C_s V_s)/dt$, where $V_s$ is the sensing voltage across the sense capacitor $C_s$. The total pick-up current $I(t) = I_s(t) + I_p(t)$ consists of both the motional and the parasitic currents, and is converted to the final output voltage V(t) with trans-impedance gain –R. Parasitic current is induced by the drive voltage $V_d$ and therefore has the same frequency $\omega_d$. In this embodiment we assume that the total sensing voltage $V_{sense}(t) = V_{dc} + V_c(t)$ is composed of a DC component $V_{dc}$ and an AC component $V_c = v_c \sin(\omega_c t)$, called the carrier. Particular cases when either the DC or AC component of the sense voltage is zero are discussed below. Use of an AC carrier voltage results in an amplitude modulation of the motional signal, known as electromechanical amplitude modulation (EAM).

According to laws of electrostatics, the total pick-up voltage on the output of the current amplifier is $$V(t) = -R\frac{d}{dt}[V_d(t)C_p + (V_c(t) + V_{dc})C_s(t)]. \quad (2)$$

Consider now motion detection with parallel plates, namely the nonlinear properties of parallel plate EAM pick-up signal. Details are presented in A. Trusov and A. M. Shkel, "Nonlinearity of capacitive detection in resonant mems," to be published, IEEE ID JMEMS 2006-0286, 200712 which are summarized here for completeness of the discussion. Consider a variable sense capacitor $C_s(t)$ formed by a pair of mobile and anchored parallel plate structures. Let us denote media permittivity by $\epsilon$, the initial gap between plates at rest by g, individual parallel plate pair overlap length –L, and plate height (i.e. structural layer thickness) by y. The total overlap area in the sense capacitor is given by A=NLy, where N is a number of parallel plate pairs in the capacitor. The total variable sense capacitance for the harmonic mode of motion (1) is $$C_s(t) = \frac{\varepsilon A}{g - x(t)} = \frac{\varepsilon A}{g}\frac{1}{1 - \frac{\|x\|}{g}\sin(\omega_d t)}, \quad (3)$$

where the phase of motion $\phi$ is omitted without any loss of generality.

We introduce nominal sense capacitance $C_{sn} = \epsilon A/g$ and dimensionless amplitude of motion $x_o = \|x\|/g < 1$ (normalized with respect to the initial gap between parallel plates). From (3), the sense capacitance is $$C_s(t) = C_{sn}\frac{1}{1 - x_0\sin(\omega_d t)}. \quad (4)$$

As shown in A. Trusov and A. M. Shkel, "Nonlinearity of capacitive detection in resonant mems," to be published, IEEE ID JMEMS 2006-0286, 200712, the Fourier series representation for the parallel plate capacitance $C_s(t)$ for a given amplitude of motion $x_o$ is $$C_s(t) = C_{sn}\sum_{k=0}^{\infty} p_{2k}(x_0)\cos(2k\omega_d t) + C_{sn}\sum_{k=0}^{\infty} p_{2k+1}(x_0)\sin((2k+1)\omega_d t), \quad (5)$$

where functions $p_k(x_o)$ define the amplitudes of the multiple harmonics in the capacitance $C_s(t)$ and are given by $$p_0(x_0) = \sum_{n=0}^{\infty} \frac{C(2n, n)}{2^{2n}} x_0^{2n}, \text{ and for } k = 0, 1, 2 \ldots \infty \quad (6)$$

-continued $$p_{2k}+1(x_0) = (-1)^k \sum_{n=k}^{\infty}\left\{\frac{C(2n+1, n-k)x_0^{2n+1}}{2^{2n}}\right\}$$

$$p_{2k}(x_0) = (-1)^k \sum_{n=k}^{\infty}\left\{\frac{C(2n, n-k)x_0^{2n}}{2^{2n-1}}\right\}.$$

Figure 2:
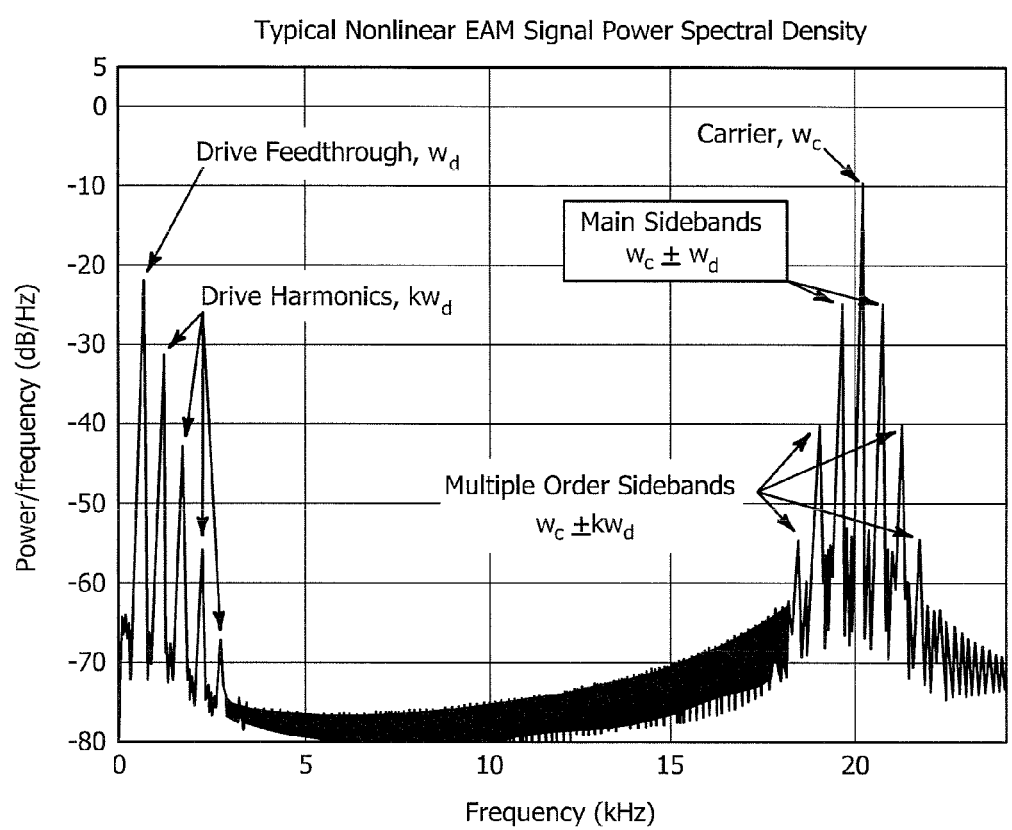
FIG. 2 is a graph of the frequency domain profile of the parallel plate EAM pick-up signal produced by a computer simulation, i.e. power/frequency as a function of frequency.

Equation (5) shows that when parallel plates are used to sense the harmonic motion, the time varying sense capacitance contains an infinite number of drive frequency harmonics. In order to calculate the total output signal, we consider modulation of each capacitive harmonic individually. Following A. Trusov and A. M. Shkel, "Nonlinearity of capacitive detection in resonant mems," to be published, IEEE ID JMEMS 2006-0286, 200712, we combine the sense capacitance in (5) with (2) to calculate the total output current:

$$I(t) = -C_p v_d \omega_d \sin(\omega_d t) + C_{sn} v_c \omega_c p_0(x_0)\cos(\omega_c t) + \quad (7)$$

$$C_{sn} V_{dc} \omega_d \left\{\sum_{k=0}^{\infty}(2k+1)p_{2k+1}(x_0)\cos((2k+1)\omega_d t) - \sum_{k=1}^{\infty}2k p_{2k}(x_0)\cos(2k\omega_d t)\right\} +$$

$$\frac{1}{2}C_{sn}v_c\left\{\sum_{k=0}^{\infty}p_{2k+1}(x_0)\left[\begin{array}{c}\omega_{(2k+1)}\sin(\omega_{(2k+1)}t) - \\ -\omega_{-(2k+1)}\sin(\omega_{-(2k+1)}t)\end{array}\right]\right\} +$$

$$\frac{1}{2}C_{sn}v_c\left\{\sum_{k=1}^{\infty}p_{2k}(x_0)\left[\begin{array}{c}\omega_{(2k)}\cos(\omega_{(2k)})t) + \\ +\omega_{(-2k)}\cos(\omega_{(-2k)})t)\end{array}\right]\right\},$$

where $\omega_k = \omega_c + k\omega_d$ is the frequency of the $\|k\|$ order sideband (left or right, depending on the sign of k). The equation gives the Fourier series for the total pick-up signal for the case of parallel plate capacitive detection of harmonic motion. FIG. 2 shows the frequency domain representation of a typical parallel plate EAM pick-up signal and illustrates its important features. The signal contains an infinite number of harmonics corresponding to the drive frequency and multiple informational sidebands.

a. Let $V_\omega$ denote harmonic component of frequency $\omega$ of the total output voltage V=–RI. According to Equation (7), the amplitudes of the right and left sidebands in the total output voltage are given by b.

$$\|V_{\omega\pm k}\| = \frac{1}{2}RC_{sn}v_c\|(\omega_c \pm k\omega_d)p_k(x_0)\|. \quad (8)$$

In practice, a high frequency carrier is usually used, so that $\omega_c \gg k\omega_d$ for several first orders k=1, 2, 3 . . . K. For these sidebands, $$\|V_{\omega\pm k}\| = \frac{1}{2}RC_{sn}v_c(\omega_c \pm k\omega_d)\|p_k(x_0)\| \quad (9)$$

$$\approx \frac{1}{2}RC_{sn}v_c\omega_c\|p_k(x_0)\|.$$

The amplitudes of the multiple sidebands are proportional to functions $p_k(x_o)$, which we call normalized sidebands amplitudes. It can be shown that a simple closed form expressions for normalized sidebands amplitudes can be derived from Equation (6):

$$\|p_k(x_0)\| = \frac{1}{\sqrt{1-x_0^2}} \left( \frac{x_0}{\left(1+\sqrt{1-x_0^2}\right)} \right)^k \quad (10)$$

$$= 2p_0(x_0) \left( \frac{x_0}{\left(1+\sqrt{1-x_0^2}\right)} \right)^k.$$

According to this equation, for a fixed motional amplitude $x_o$, normalized amplitudes of multiple sidebands form a geometric progression with ratio $$r = \|p_{k+1}(x_0)\| / \|p_k(x_0)\| = \frac{x_0}{1+\sqrt{1-x_0^2}}. \quad (11)$$

Below we discuss how simultaneous demodulation of the multiple sidebands can be used to produce a self-calibrated measurement of the motional amplitude $x_o$ and provide experimental confirmation of Equation (11).

Consider now the robust demodulation of a parallel plate EAM signal. Here we discuss how ratio of parallel plate EAM sidebands can be used to robustly detect motion. First, we review a conventional approach to EAM detection.

In the conventional linear approach (i.e., for lateral comb sense capacitor or parallel plate sense capacitor with small amplitude) only main (k=1) sidebands are considered. Also, the amplitudes of these main sidebands are assumed to be linear with respect to the amplitude of motion, $\|V_{\omega_c \pm \omega_d}\| \propto x_0$. In the conventional approach, the extraction of the motional amplitude from the EAM pick up signal consists of amplitude demodulation and scaling steps:

a. Mixing V(t) with phase shifted carrier signal (i.e., multiplication $V(t) \otimes \sin(\omega_c t)$) to map the sidebands from $\omega_c \pm \omega_d$ to $\omega_d$ frequency.
b. Low-pass filtering to attenuate at frequencies higher than $\omega_d$.
c. Mixing the resulting signal with $\sin(\omega_d t + \alpha)$ to map the signal from $\omega_d$ to DC. Phase $\alpha$ needs to be controlled to match the phase of motion; alternatively, a dual phase I/Q demodulation can be used.
d. The obtained DC signal is scaled by $(RC_{sn}V_c\omega_c)^{-1}$ to calculate the amplitude of mechanical motion.

Consider a resonant MEMS device in which amplitude of motion in certain vibrational mode needs to be detected precisely. In the case of parallel plate sense capacitor, the amplitudes of the informational sidebands are not linear with respect to the amplitude of motion. This nonlinearity introduces significant error if large amplitude of motion is measured. As shown in A. Trusov and A. M. Shkel, "Nonlinearity of capacitive detection in resonant mems," to be published, IEEE ID JMEMS 2006-0286, 200712, the amplitude of motion can be measured precisely by adding an additional step to the described demodulation procedure:

$$x_0(p_1) = \frac{(w^2 - 12 + p_1^2 - p_1 w)(w^2 - 12 + p_1^2 + 2pw)}{18 p_1 w^2}, \quad (12)$$

where $$w = (72 p_1 - p_1^3 + 6(48 + 132 p_1^2 - 3 p_1^4))^{\frac{1}{6}}.$$

Both conventional approach and Equation (12) produce the measurement based on assumed values of such system parameters as trans-resistance gain, nominal capacitance, and carrier voltage. In this case, each device needs to be calibrated to identify these mechanical and electrical parameters. Moreover, during operation, some of these parameters are prone to drifts, causing loss of the calibration. Approaches based on only the first order sidebands do not provide a robust solution.

Consider now the robust approach of the illustrated embodiment. In the case of parallel plate sense capacitors, it is possible to detect arbitrary amplitude of motion without using R, $C_{sn}$, $\omega_c$ and $v_c$. The approach is based on simultaneous processing of multiple sidebands and produces measurement of $x_o$ by using a ratio r of two different order sidebands.

According to Equation (8) and Equation (11), the ratio of amplitudes of any two succeeding low order sidebands depends only on the amplitude of motion $x_o$, while all the other parameters cancel out:

$$\frac{\|V_{\omega-(k+1)}\| + \|V_{\omega(k+1)}\|}{\|V_{\omega-k}\| + \|V_{\omega_k}\|} = \frac{\|p_{k+1}(x_0)\|}{\|p_k(x_0)\|}$$

$$= r(x_0)$$

$$= \frac{x_0}{\left(1+\sqrt{1-x_0^2}\right)}.$$

According to Equation (9), the same is approximately valid for a ratio of low order single side sidebands:

$$r(x_0) \approx \frac{\|V_{\omega_c \pm (k+1)\omega_d}\|}{\|V_{\omega_c \pm k\omega_d}\|}. \quad (13)$$

There is a simple one-to-one relationship between the amplitude of motion and the amplitude ratio of the two succeeding parallel plate EAM sidebands. Solving Equation (11) for the amplitude of motion yields $$x_0 = \frac{2r}{r^2 + 1}. \quad (14)$$

This relationship can be linearized in order to provide a very simple method of $x_o$ estimation:

$$x_0 \approx \tilde{x}_0 = 2r, \quad (15)$$

with the relative error given by $$e_{\tilde{x}_0} = \frac{x_0 - \tilde{x}_0}{x_0} = r^2. \quad (16)$$

Figure 3:
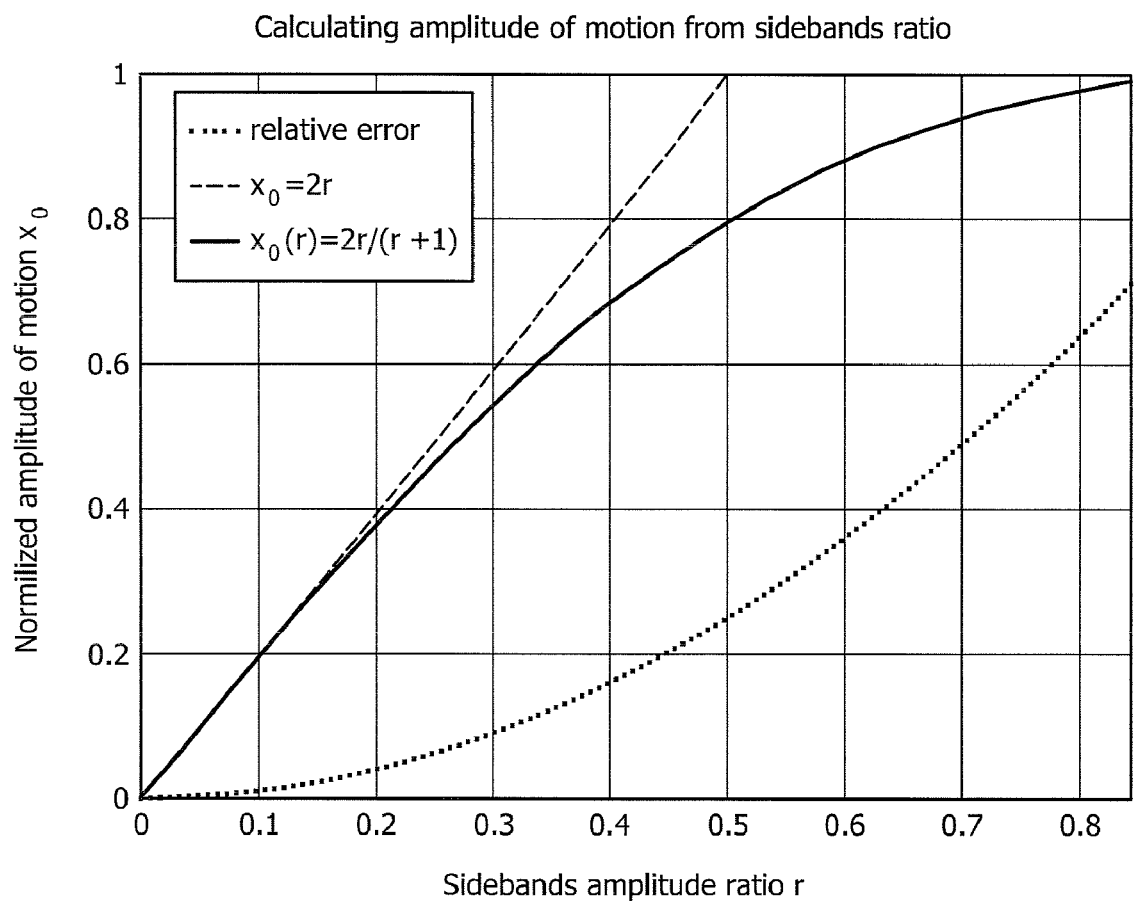
FIG. 3 is a graph of the detection of the amplitude of motion based on measured ratio of two sidebands amplitudes, i.e. the normalized amplitude of motion as a function of sidebands amplitude ratio r.

FIG. 3 illustrates Equation (14), Equation (15), and Equation (16). In the case of parallel plate EAM detection, normalized amplitude of motion $x_o$ can be precisely calculated as in Equation (14) or estimated by Equation (15) based on a single parameter—amplitude ratio of two succeeding sidebands $r(x_o)$. Feasibility of the disclosed measurement technique is demonstrated using experimental data below.

A real-time robust detection of motion based on the ratio of sidebands can be performed by the following procedure:

a. Detect amplitude of the first order sidebands at frequencies $\omega_c \pm \omega_d$.

b. Detect amplitude of the second order sidebands at frequencies $\omega_c \pm 2\omega_d$.

c. Calculate the ratio of amplitudes $$r = \frac{\|V_{\omega_{-2}}\| + \|V_{\omega_2}\|}{\|V_{\omega_{-1}}\| + \|V_{\omega_1}\|}$$

or estimate using a single side pair of sidebands $$r \approx \frac{\|V_{\omega_{-2}}\|}{\|V_{\omega_{-1}}\|} \approx \frac{\|V_{\omega_2}\|}{\|V_{\omega_1}\|}.$$

d. Calculate normalized amplitude of motion $$x_0 = \frac{2r}{r^2+1}.$$

The first two steps, the demodulation procedures, are performed simultaneously. Demodulation of the first and second order sidebands can be done similarly to the conventional case, described above. A complete real-time signal processing algorithm based on two single side sidebands is presented below along with simulation results.

Consider now the implementations of the illustrated embodiment of the invention. Here we show how the disclosed robust detection method can be applied to differential EAM and pure DC detection methodologies. Turn first to differential EAM. In the case of differential EAM, even order sidebands cancel out from the total pick-up signal, while odd order sidebands double in amplitude. Similarly to the regular case, the amplitude of motion $x_o$ is calculated using Equation (14); parameter r can be calculated from the ratio of third and first sidebands according to $$r(x_0) = \sqrt{\frac{\|V_{\omega_{-(k+2)}}\| + \|V_{\omega_{(k+2)}}\|}{\|V_{\omega_{-k}}\| + \|V_{\omega_k}\|}} \qquad (17)$$

$$= \sqrt{\frac{\|p_{k+2}(x_0)\|}{\|p_k(x_0)\|}}$$

$$\approx \sqrt{\frac{\|V_{\omega \pm (k+2)}\|}{\|V_{\omega \pm k}\|}}.$$

Turn now and consider detection with a pure DC voltage. In some cases the effect of parasitics is negligible and capacitive detection is done with a DC biased sense capacitor. This configuration does not involve any carrier and is described by Equation (7) with $v_c=0$. In this case the total output voltage is given by $$V(t) = -RC_{sn}V_{dc}\omega_d \sum_{k=1}^{\infty}(-1)^{k+1}kp_k(x_0)\cos(k\omega_d t). \qquad (18)$$

The information on the amplitude of motion is carried by the harmonics at multiples of the drive frequency. In conventional linear approach only the first harmonic is considered and is assumed to be proportional to the amplitude of motion. In the complete nonlinear case, the amplitude $x_o$ can be calculated based on the ratio of the subsequent harmonics Equation (14). In turn, the ratio r is easily obtained from the pick up voltage:

$$r(x_0) = \frac{\|p_{k+1}(x_0)\|}{\|p_k(x_0)\|} \qquad (19)$$

$$= \frac{k\|V_{(k+1)\omega_d}\|}{(k+1)\|V_{k\omega_d}\|}$$

$$= \frac{\|V_{2\omega_d}\|}{2\|V_{\omega_d}\|}.$$

In the common case of differential detection with DC biased parallel plate sense capacitors, only odd order sidebands are present; the ratio r can be calculated from the total pick up voltage as $$r(x_0)\sqrt{\frac{k\|V_{(k+2)\omega_d}\|}{(k+2)\|V_{k\omega_d}\|}} \qquad (20)$$

$$= \sqrt{\frac{\|V_{3\omega_d}\|}{3\|V_{\omega_d}\|}}.$$

For instance, a ratio of first and third drive frequency harmonics can be used.

Figure 4A:
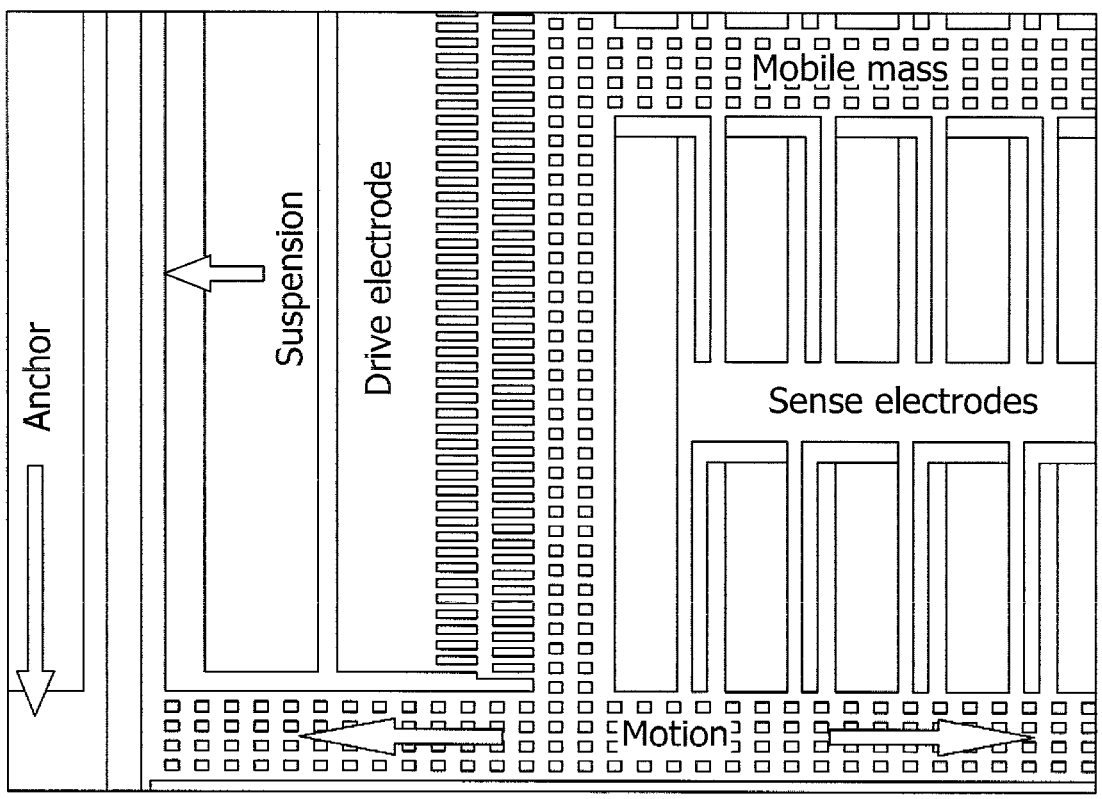
FIG. 4a is a SEM micrograph of a quarter of the tested device.
Figure 4B:
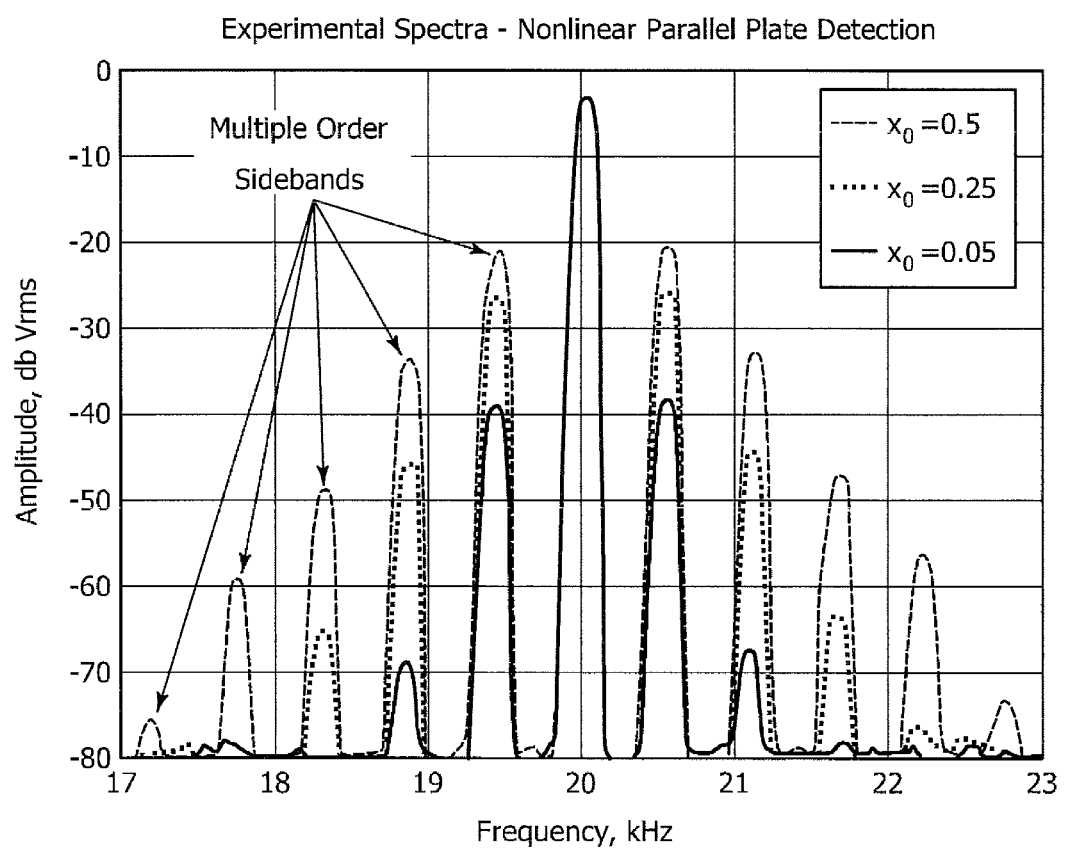

Turn now and consider experimental and simulation results that experimental demonstration of the illustrated embodiment of the invention showing detection of amplitude motion $x_o$ based on measured sideband ratio r shown in the graph of FIG. 4b.

| visually detected $x_0$ | sidebands ratio r | $x_0$ calculated by (14) |
|---|---|---|
| ≈0.05 | 29.2 dB = 28.8 | 0.07 |
| ≈0.25 | 17.5 dB = 7.5 | 0.26 |
| ≈0.5 | 12 dB = 4 | 0.47 |

In order to verify the relationship Equation (14) between amplitude of motion and the ratio of sidebands, test structures were designed, fabricated, and characterized. The devices are capacitive MEMS resonators with lateral comb drive capacitors, and lateral comb and parallel plate sense capacitors. The fabrication was done using in-house wafer level SOI process. SOI wafers with a highly conductive 50 μm thick device layer were used. AZ4620 photoresist was spin-coated onto the wafers and patterned using a chrome-on-glass mask and a Karl Suss MA6 exposure system. After photoresist development, the wafers were subjected to a timed deep reactive ion etching (DRIE) using Surface Technology Systems (STS)

tool. Minimum gap feature of the process is 5 μm and minimum structural feature is 8 μm. Nominal capacitive gap in the parallel plate sense structure is 25 μm; an SEM image of the fabricated test resonator is shown in FIG. 4(*a*).

The device was driven into linear vibrations using a lateral comb drive capacitor with a combination of 30 V DC and a 3.5 $V_{rms}$ AC at 555 Hz. An AC carrier voltage of 5 $V_{rms}$ at 20 kHz was applied to the mobile mass. FIG. 4*b* shows the spectral profile of the generated pick up signal at three different amplitudes of motion, which were estimated using a microscope. As expected, multiple sidebands are present in the spectrum, and their amplitudes form a geometric progression, which is seen as linear decay of amplitudes on a logarithmic scale. Table 1 summarizes these spectral measurements based on sidebands ratio Equation (14). As anticipated, the amplitudes of motion can be easily calculated from the ratio of subsequent sidebands without using any other system parameters.

Turn now to the modeling of the complete real-time algorithm. In the case of parallel plate EAM, ratio of the amplitudes of succeeding sidebands can be used to measure the amplitude of motion independently of such parameters as current amplifier gain, nominal sense capacitance, and carrier voltage. A real-time measurement algorithm based on Equation (13) and Equation (14) was developed and simulated using Simulink software.

Figure 5A:
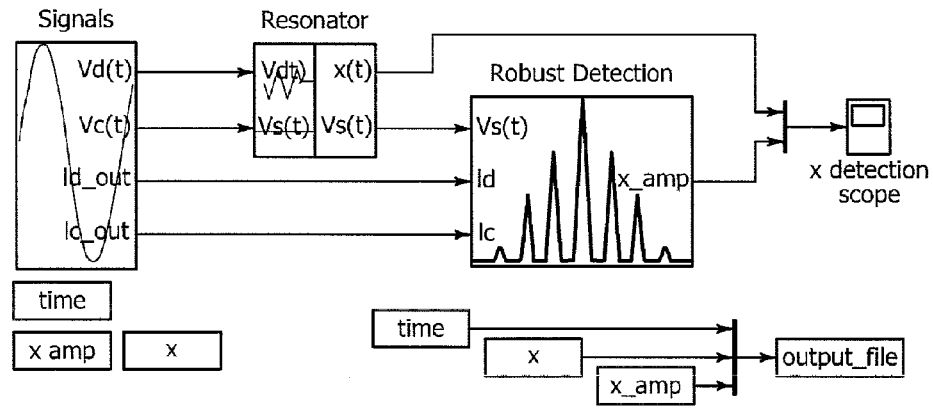
FIG. 5a is a diagrammatic overall view of a Simulink model of a resonator with parallel plate robust detection.

FIG. 5*a* shows the overall view of the Simulink model. It is comprised of the following high level blocks:

The "Signals" block generates drive and carrier voltages.

The "Resonator" block represents a capacitive resonator. The outputs of this block are the displacement x(t) and the parallel plate EAM pick up voltage Vs(t).

The "Robust Detection" block extracts the amplitude of motion from the ratio of parallel plate EAM sidebands.

Figure 5B:
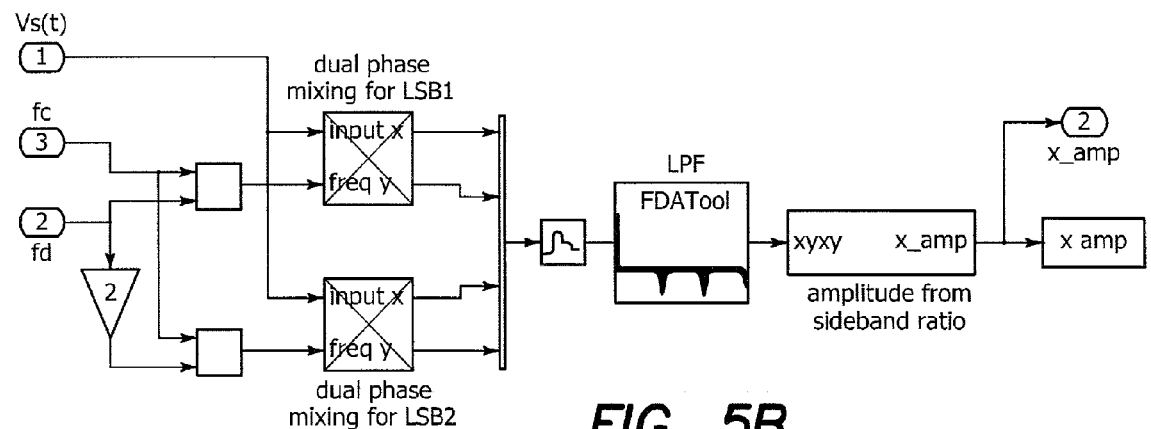
FIG. 5b is a block diagram of a "Robust Detection" block.
Figure 6A:
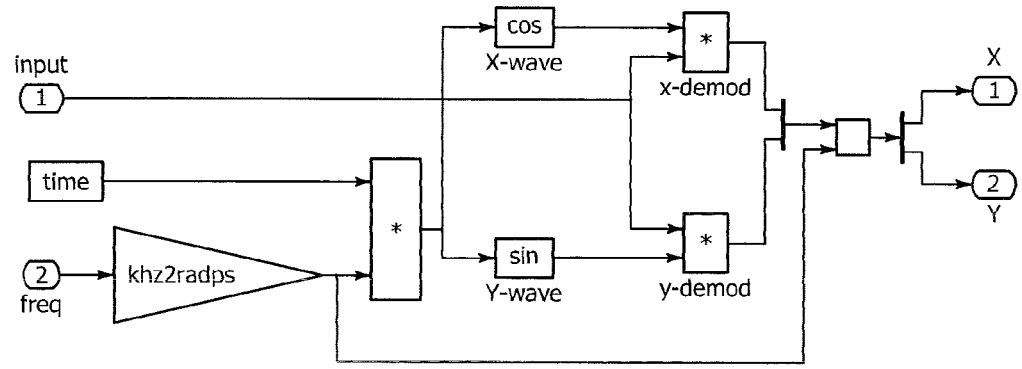
FIG. 6a is a "Dual-phase mixing" block diagram of Simulink model of a resonator with parallel plate robust detection.
Figure 6B:
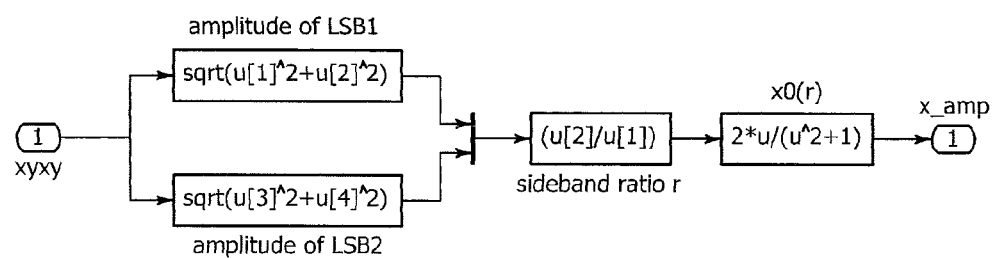
FIG. 6b is a "Amplitude calculation" block diagram.
Figure 7A:
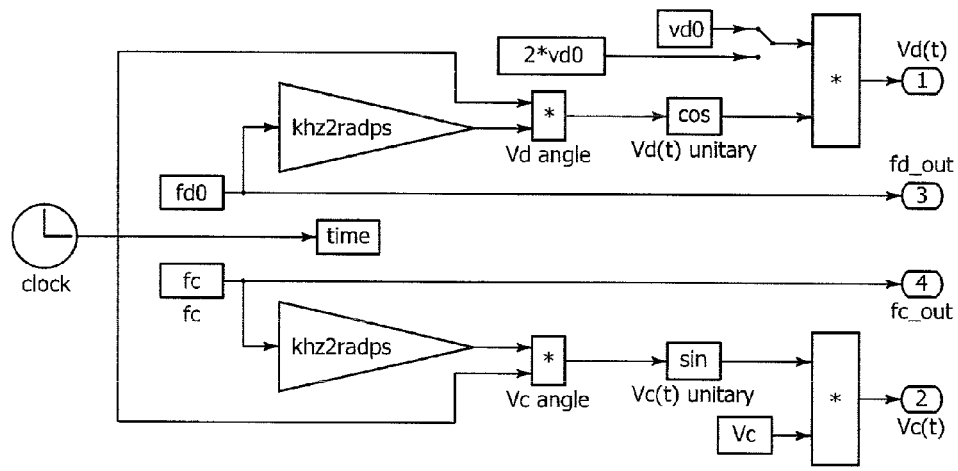
FIG. 7a is a diagram of the "Signals" block in a Simulink model of a resonator with parallel plate robust detection.
Figure 7B:
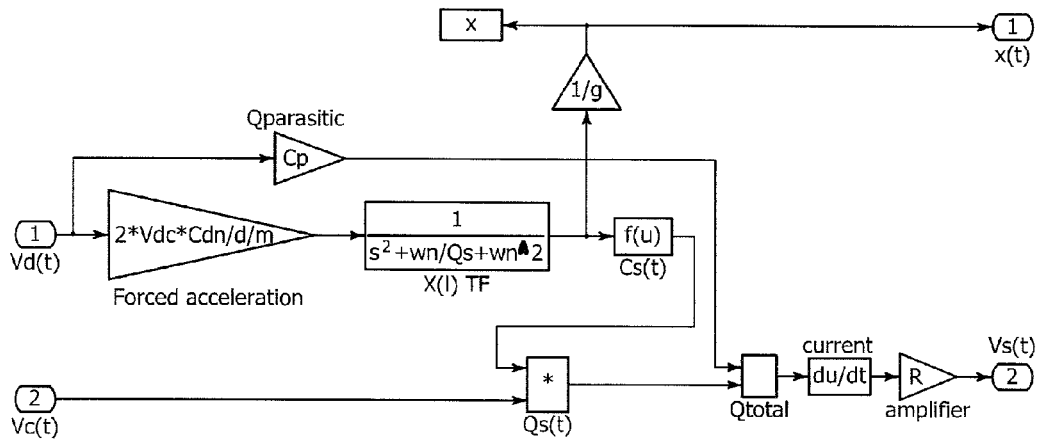
FIG. 7b is a block diagram of the "Resonator" block.

FIG. 5*b* shows the demodulation procedure, which is comprised of two steps: 1) amplitude demodulation of two succeeding sidebands, and 2) calculation of the motional amplitude from the ratio of sidebands amplitudes. The "Robust Detection" block includes dual phase mixing at frequencies of the first and second left sidebands, FIG. 6*a*. Extraction of the amplitude of motion according to Equation (14) is done by the "x_amp calc" block, FIG. 6*b*. The rest of the model blocks are shown in FIG. 7*a* and FIG. 7*b*.

Figure 8:
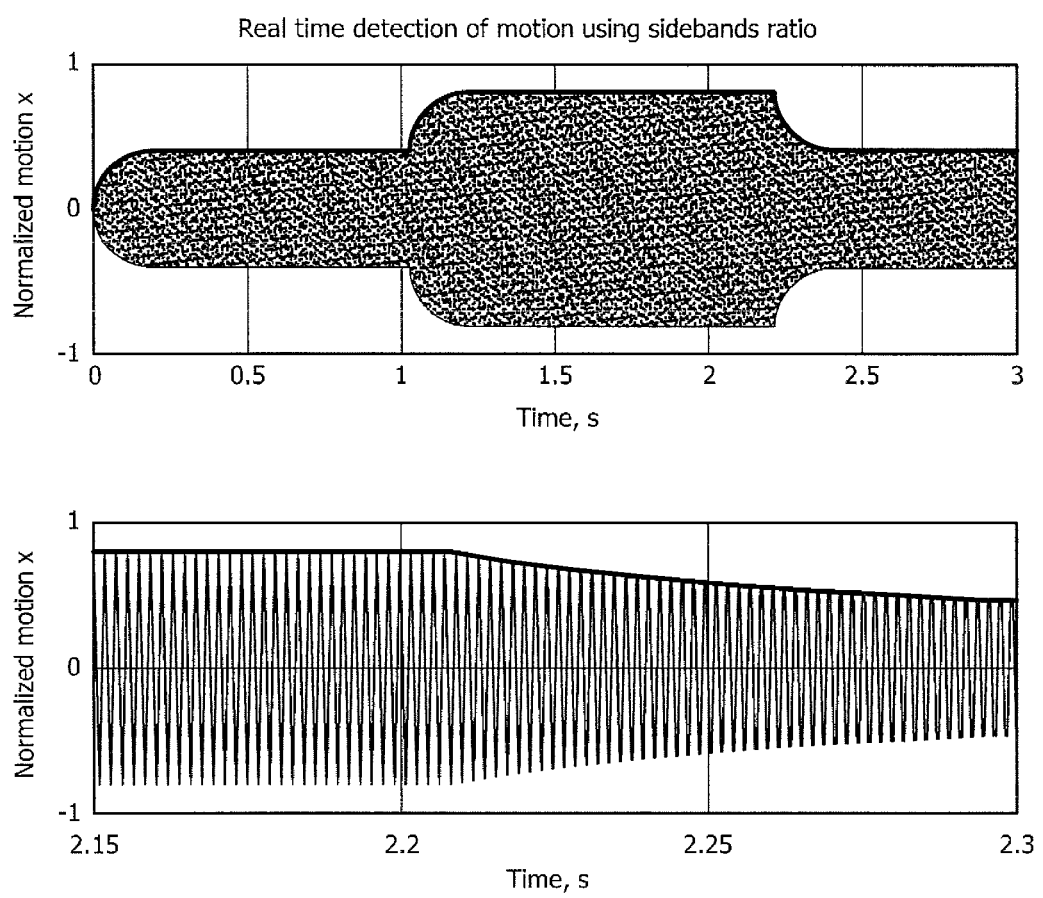
FIG. 8 is a graph of the robust detection of motional amplitude based on sidebands ratio Equation (14), simulation results.

The described Simulink model was used to verify feasibility of the disclosed real-time robust detection method. FIG. 8 shows the results of simulation for a resonator with quality factor Q=100 and natural frequency $f_n$=0.555 Hz. The carrier voltage was 2 $V_{pk}$ at 10 kHz. Other simulation parameters include nominal sense capacitance $C_{sn}$=1 pF, and transresistance amplifier gain of 0.5 MΩ. During the simulation the driving AC voltage was switched between 1 Vpk and 2Vpk, causing changes of the motional amplitude. The results of the simulation confirm feasibility of the detection algorithm based on the ratio of sidebands.

Properties of the pick-up voltage $V_s$, depend on the gain of the current amplifier, value of nominal sense capacitance and carrier voltage. The detection algorithm shown in FIG. 5*b* is based on sidebands ratio Equation (14). The only system parameters used in this measurement algorithm are frequencies of drive and carrier voltages, which are typically generated by the control circuit itself. Unlike conventional approach, the disclosed algorithm is independent of most system parameters, such as trans-impedance gain of the current amplifier, nominal sense capacitance, and carrier voltage.

Therefore, it can now be appreciated that the illustrated embodiment of the invention includes a capacitive detection methodology, comprised of the use of parallel plate sense capacitor(s) and signal processing algorithm, for detection of vibratory motion with the following advantages over conventional approaches: 1) precise detection of arbitrary amplitude of motion 2) independence from system parameters, which are prone to imperfect fabrication and drift (nominal sense capacitance, probing voltage, gain of electrical pick-up current amplifier etc.)

Implementation of the above methodology includes the cases of: detection using both DC and/or AC probing voltage, and detection using single side sense capacitor as well as using differential (balanced) sense capacitors.

The methodology can be used as a substitute for conventional methodologies, or for automatic calibration of the latter The methodology can be implemented using the same common components (e.g. operational amplifiers) as conventional detection methodologies.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A capacitive detection method in a MEMS resonator comprising:

vibrating a resonator with a drive signal;

sensing vibration of the resonator by detecting a plurality of sidebands of an electromechanical amplitude modulation signal in a capacitive detector; and extracting amplitude of motion from a ratio of two simultaneously sensed sidebands of different order, where $\omega_c$ is a carrier frequency and $\omega_d$ a drive frequency applied to the resonator, where sensing vibration of the resonator by detecting a plurality of sidebands of an electromechanical amplitude modulation signal in a capacitive detector comprises detecting amplitudes of first order sidebands at frequencies $\omega_c \pm \omega_d$ and detecting amplitudes of second order sidebands at frequencies $\omega_c \pm 2\omega_d$; and where extracting amplitude of motion from a ratio of two simultaneously sensed sidebands of different order comprises calculating a ratio of amplitudes using $$r = \frac{\|V_{\omega_{-2}}\| + \|V_{\omega_2}\|}{\|V_{\omega_{-1}}\| + \|V_{\omega_1}\|}$$

or estimate using a single side pair of sidebands using $$r \approx \frac{\|V_{\omega_{-2}}\|}{\|V_{\omega_{-1}}\|} \approx \frac{\|V_{\omega_2}\|}{\|V_{\omega_1}\|}$$

and calculating normalized amplitude of motion $$x_0 = 2r/r^2 + 1.$$

2. The method of claim 1 where extracting amplitude of motion from a ratio of two simultaneously sensed sidebands of different order comprises simultaneously processing multiple sidebands and producing a measurement of $x_o$ by using a ratio r of two different order sidebands.

3. The method of claim 2 where sensing vibration of the resonator by detecting a plurality of sidebands of an electromechanical amplitude modulation signal in a capacitive detector and simultaneously processing multiple sidebands and producing a measurement of $x_o$ by using a ratio r of two different order sidebands comprises sensing a first pair of sidebands $V_{\omega_{-(k+1)}}$ and $V_{\omega_{(k+1)}}$ and a second pair of sidebands $V_{\omega_{-k}}$ and $V_{\omega_k}$, obtaining the ratio $r(x_o)$ $$\frac{\|V_{\omega_{-(k+1)}}\| + \|V_{\omega_{(k+1)}}\|}{\|V_{\omega_{-k}}\| + \|V_{\omega_k}\|} = r(x_0)$$
$$= \frac{x_0}{\left(1 + \sqrt{1 - x_0^2}\right)}$$

and deriving $x_o$ therefrom, where $x_o$ is normalized motional amplitude, where $V_{\omega_i}$ is the harmonic component of a $i^{th}$ sideband frequency $\omega_i$ of the total output voltage.

4. The method of claim 2 where sensing vibration of the resonator by detecting a plurality of sidebands of an electromechanical amplitude modulation signal in a capacitive detector and simultaneously processing multiple sidebands and producing a measurement of $x_o$ by using a ratio r of two different order sidebands comprises sensing a first pair of sidebands $V_{\omega_{-(k+1)}}$ and $V_{\omega_{-(k+1)}}$ and a second pair of sidebands $V_{\omega_{-k}}$ and $V_{\omega_k}$, obtaining the ratio $r(x_o)$ $$r(x_0) \approx \frac{\|V_{\omega_c \pm (k+1)\omega_d}\|}{\|V_{\omega_c \pm k\omega_d}\|}$$
$$r(x_0) = \frac{x_0}{\left(1 + \sqrt{1 - x_0^2}\right)}$$

and deriving $x_o$ therefrom, where $x_o$ is normalized motional amplitude, where $V_{\omega_i}$ is the harmonic component of a $i^{th}$ sideband frequency $\omega_i$ of the total output voltage.

5. The method of claim 4 where deriving $x_o$ comprises setting $x_o = 2r(x_o)$.

6. The method of claim 1, where $\omega_c$ is a carrier frequency and $\omega_d$ a drive frequency applied to the resonator, where sensing vibration of the resonator by detecting a plurality of sidebands of an electromechanical amplitude modulation signal in a capacitive detector comprises differentially detecting amplitudes of a first pair of sidebands at frequencies $\omega_c \pm k\omega_d$ where k is an odd integer and detecting amplitudes of a second pair of sidebands at frequencies $\omega_c \pm (k+2)\omega_d$; and where extracting amplitude of motion from a ratio of two simultaneously sensed sidebands of different order comprises calculating a ratio of amplitudes using $$r(x_0) = \sqrt{\frac{\|V_{\omega_{-(k+2)}}\| + \|V_{\omega_{(k+2)}}\|}{\|V_{\omega_{-k}}\| + \|V_{\omega_k}\|}}$$

and calculating normalized amplitude of motion from $r(x_o)$.

7. The method of claim 1, where $\omega_c$ is a carrier frequency and $\omega_d$ a drive frequency applied to the resonator, where sensing vibration of the resonator by detecting a plurality of sidebands of an electromechanical amplitude modulation signal in a capacitive detector comprises differentially detecting amplitudes of a first pair of sidebands at frequencies $\omega_c \pm k\omega_d$ where k is an odd integer and detecting amplitudes of a second pair of sidebands at frequencies $\omega_c \pm (k+2)\omega_d$; and where extracting amplitude of motion from a ratio of two simultaneously sensed sidebands of different order comprises calculating a ratio of amplitudes using $$r(x_o) \approx \sqrt{\frac{\|V_{\omega_{\pm(k+2)}}\|}{\|V_{\omega_{\pm k}}\|}}$$

and calculating normalized amplitude of motion from $r(x_o)$.

8. The method of claim 1, where $\omega_d$ a drive frequency applied to the resonator, where the electromechanical amplitude modulation signal is a DC signal, and where sensing vibration of the resonator by detecting a plurality of sidebands of an electromechanical amplitude modulation signal in a capacitive detector comprises detecting amplitudes at frequencies $\omega_d$ and $2\omega_d$; and where extracting amplitude of motion from a ratio of two simultaneously sensed sidebands of different order comprises calculating a ratio of amplitudes using $$r(x_o) = \frac{\|V_{2\omega_d}\|}{2\|V_{\omega_d}\|}$$

and calculating normalized amplitude of motion from $r(x_o)$.

9. The method of claim 1, where $\omega_d$ a drive frequency applied to the resonator, and where the electromechanical amplitude modulation signal is a DC signal, and where sensing vibration of the resonator by detecting a plurality of sidebands of an electromechanical amplitude modulation signal in a capacitive detector comprises differentially detecting amplitudes at frequencies odd harmonic drive frequencies $k\omega_d$ and $(k+2)\omega_d$ where k is an odd integer, and where extracting amplitude of motion from a ratio of two simultaneously sensed sidebands of different order comprises calculating a ratio of amplitudes using $$r(x_o) = \sqrt{\frac{k\|V_{(k+2)\omega_d}\|}{(k+2)\|V_{k\omega_d}\|}} = \sqrt{\frac{\|V_{3\omega_d}\|}{3\|V_{\omega_d}\|}}.$$

and calculating normalized amplitude of motion from $r(x_o)$.

10. A capacitive detection system for use with a MEMS resonator comprising:

a sensor of the vibration of the resonator for detecting a plurality of sidebands of an electromechanical amplitude modulation signal; and means for extracting an amplitude of motion from a ratio of two simultaneously sensed sidebands of different order, where $\omega_c$ is a carrier frequency and $\omega_d$ a drive frequency applied to the resonator, where the sensor capacitively senses vibration of the resonator by detecting a plurality of sidebands of an electromechanical amplitude modulation signal and comprises means for detecting amplitudes of first order sidebands at frequencies $\omega_c \pm \omega_d$ and means for detecting amplitudes of second order sidebands at frequencies $\omega_c \pm 2\omega_d$; and where the means for extracting amplitude of motion from a ratio of two simultaneously sensed sidebands of different order comprises means for calculating a ratio of amplitudes using $$r = \frac{\|V_{\omega_{-2}}\| + \|V_{\omega_2}\|}{\|V_{\omega_{-1}}\| + \|V_{\omega_1}\|}$$

or an estimate using a single side pair of sidebands using $$r \approx \frac{\|V_{\omega_{-2}}\|}{\|V_{\omega_{-1}}\|} \approx \frac{\|V_{\omega_2}\|}{\|V_{\omega_1}\|}$$

and means for calculating normalized amplitude of motion $$x_0 = \frac{2r}{r^2 + 1}.$$

11. The detection system of claim 10 where the means for extracting the amplitude of motion from a ratio of two simultaneously sensed sidebands of different order comprises means for simultaneously processing multiple sidebands and producing a measurement of $x_o$ by using a ratio r of two different order sidebands.

12. The detection system of claim 11 where the sensor capacitively senses vibration of the resonator by detecting a plurality of sidebands of an electromechanical amplitude modulation signal and the means for simultaneously processing multiple sidebands and producing a measurement of $x_o$ by using a ratio r of two different order sidebands comprises means for sensing a first pair of sidebands $V_{\omega_{-(k+1)}}$ and $V_{\omega_{(k+1)}}$ and a second pair of sidebands $V_{\omega_{-k}}$ and $V_{\omega_k}$, means for obtaining the ratio $r(x_o)$ $$\frac{\|V_{\omega_{-(k+1)}}\| + \|V_{\omega_{(k+1)}}\|}{\|V_{\omega_{-k}}\| + \|V_{\omega_k}\|} = r(x_0) = \frac{x_0}{\left(1 + \sqrt{1 - x_0^2}\right)}$$

and means for deriving $x_o$ therefrom, where $x_o$ is normalized motional amplitude, where $V_{\omega_i}$ is the harmonic component of a $i^{th}$ sideband frequency $\omega_i$ of the total output voltage.

13. The detection system of claim 11 where the sensor capacitively senses vibration of the resonator by detecting a plurality of sidebands of an electromechanical amplitude modulation signal and the means for simultaneously processing multiple sidebands and producing a measurement of $x_o$ by using a ratio r of two different order sidebands comprises
means for sensing a first pair of sidebands $V_{\omega_{-(k+1)}}$ and $V_{\omega_{(k+1)}}$ and a second pair of sidebands $V_{\omega_{-k}}$ and $V_{\omega_k}$,
means for obtaining the ratio $r(x_o)$ $$r(x_0) \approx \frac{\|V_{\omega_c \pm (k+1)\omega_d}\|}{\|V_{\omega_c \pm k\omega_d}\|}$$

$$r(x_0) = \frac{x_0}{\left(1 + \sqrt{1-x_0^2}\right)}$$

and means for deriving $x_o$ therefrom, where $x_o$ is normalized motional amplitude, where $V_{\omega_i}$ is the harmonic component of a $i^{th}$ sideband frequency $\omega_i$ of the total output voltage.

14. The detection system of claim 13 where the means for deriving $x_o$ comprises means for setting $x_o=2r(x_o)$.

15. The detection system of claim 10, where $\omega_c$ is a carrier frequency and $\omega_d$ a drive frequency applied to the resonator,
where the sensor capacitively senses vibration of the resonator by detecting a plurality of sidebands of an electromechanical amplitude modulation signal and comprises means for differentially detecting amplitudes of a first pair of sidebands at frequencies $\omega_c \pm k\omega_d$ where k is an odd integer and detecting amplitudes of a second pair of sidebands at frequencies $\omega_c \pm (k+2)\omega_d$; and where the means for extracting amplitude of motion from a ratio of two simultaneously sensed sidebands of different order comprises
means for calculating a ratio of amplitudes using $$r(x_0) = \sqrt{\frac{\|V_{\omega_{-(k+2)}}\| + \|V_{\omega_{(k+2)}}\|}{\|V_{\omega_{-k}}\| + \|V_{\omega_k}\|}}$$

and
means for calculating normalized amplitude of motion from $r(x_o)$.

16. The detection system of claim 10, where $\omega_c$ is a carrier frequency and $\omega_d$ a drive frequency applied to the resonator,
where sensor capacitively senses vibration of the resonator by detecting a plurality of sidebands of an electromechanical amplitude modulation signal in a detector and comprises means for differentially detecting amplitudes of a first pair of sidebands at frequencies $\omega_c \pm k\omega_d$ where k is an odd integer and detecting amplitudes of a second pair of sidebands at frequencies $\omega_c \pm (k+2)\omega_d$; and where the means for extracting amplitude of motion from a ratio of two simultaneously sensed sidebands of different order comprises
means for calculating a ratio of amplitudes using $$r(x_0) \approx \sqrt{\frac{\|V_{\omega_{\pm(k+2)}}\|}{\|V_{\omega_{\pm k}}\|}}$$

and
means for calculating normalized amplitude of motion from $r(x_o)$.

17. The detection system of claim 10, where $\omega_d$ a drive frequency applied to the resonator, where the electromechanical amplitude modulation signal is a DC signal, and
where the sensor capacitively senses vibration of the resonator by detecting a plurality of sidebands of an electromechanical amplitude modulation signal in a detector and comprises means for detecting amplitudes at frequencies $\omega_d$ and $2\omega_d$; and
where the means for extracting amplitude of motion from a ratio of two simultaneously sensed sidebands of different order comprises
means for calculating a ratio of amplitudes using $$r(x_0) = \frac{\|V_{2\omega_d}\|}{2\|V_{\omega_d}\|}$$

and
means for calculating normalized amplitude of motion from $r(x_o)$.

18. The detection system of claim 10, where $\omega_d$ a drive frequency applied to the resonator, and where the electromechanical amplitude modulation signal is a DC signal, and
where the sensor capacitively senses vibration of the resonator by detecting a plurality of sidebands of an electromechanical amplitude modulation signal and comprises means for differentially detecting amplitudes at frequencies odd harmonic drive frequencies $k\omega_d$ and $(k+2)\omega_d$ where k is an odd integer, and
where the means for extracting amplitude of motion from a ratio of two simultaneously sensed sidebands of different order comprises
means for calculating a ratio of amplitudes using $$r(x_0) = \sqrt{\frac{k\|V_{(k+2)\omega_d}\|}{(k+2)\|V_{k\omega_d}\|}} = \sqrt{\frac{\|V_{3\omega_d}\|}{3\|V_{\omega_d}\|}}.$$

and
means for calculating normalized amplitude of motion from $r(x_o)$.

* * * * *